(12) United States Patent
Hampp et al.

(10) Patent No.: US 8,709,949 B2
(45) Date of Patent: Apr. 29, 2014

(54) SYSTEM AND METHOD FOR REMOVING OXIDE FROM A SENSOR CLIP ASSEMBLY

(75) Inventors: Andreas Hampp, Santa Barbara, CA (US); Sean F. Harris, Santa Barbara, CA (US); Talieh H. Sadighi, Santa Barbara, CA (US); Bengi F. Hanyaloglu, Newbury Park, CA (US)

(73) Assignee: Raytheon Company, Waltham, MA (US)

( * ) Notice: Subject to any disclaimer, the term of this patent is extended or adjusted under 35 U.S.C. 154(b) by 223 days.

(21) Appl. No.: 13/107,195

(22) Filed: May 13, 2011

(65) Prior Publication Data
US 2012/0285923 A1 Nov. 15, 2012

(51) Int. Cl.
*H01L 21/302* (2006.01)

(52) U.S. Cl.
USPC ............... 438/706; 438/704; 438/709; 216/73

(58) Field of Classification Search
USPC ......... 438/704, 706, 708, 709, 710, 715, 716, 438/720, 723, 707, 714; 216/13, 66, 73
See application file for complete search history.

(56) References Cited

U.S. PATENT DOCUMENTS

| | | | |
|---|---|---|---|
| 4,935,627 A | 6/1990 | Zimmermann et al. | |
| 4,943,491 A | 7/1990 | Norton et al. | |
| 5,092,036 A | 3/1992 | Hu et al. | |
| 5,354,420 A * | 10/1994 | Russell et al. | 438/708 |
| 6,036,876 A | 3/2000 | Chen et al. | |
| 6,207,551 B1 * | 3/2001 | Chungpaiboonpatana et al. | 438/617 |
| 7,329,365 B2 | 2/2008 | Cho et al. | |
| 7,863,097 B2 | 1/2011 | Peterson et al. | |
| 8,043,972 B1 * | 10/2011 | Liu et al. | 438/723 |
| 2007/0241417 A1 * | 10/2007 | Huibers et al. | 257/436 |
| 2008/0251015 A1 * | 10/2008 | Kontani et al. | 118/715 |
| 2009/0149030 A1 | 6/2009 | Chienliu | |

* cited by examiner

*Primary Examiner* — Lan Vinh
(74) *Attorney, Agent, or Firm* — Cantor Colburn LLP

(57) ABSTRACT

According to embodiments of the present disclosure, a method for removing oxide includes placing a sensor chip assembly having an oxide layer formed on a portion thereof within an enclosed and controlled environment. The portion of the sensor chip assembly is exposed to a reactive gas and a UV light to result in a substantial removal of the oxide layer formed on the portion of the sensor chip assembly.

13 Claims, 3 Drawing Sheets

SYSTEM AND METHOD FOR REMOVING OXIDE FROM A SENSOR CLIP ASSEMBLY

TECHNICAL FIELD

This invention relates generally to a system and method for removing oxide, and more particularly, to a system and method for removing native oxide in the preparation of interconnects for used in sensor chip assemblies.

BACKGROUND OF THE INVENTION

Focal Planes (FPA) consist of a compound semiconductor sensing element (i.e., detector) and a silicon readout array (i.e., CMOS read-Out Integrated Circuit (ROIC)) joined on a pixel by pixel level. In infrared sensing systems that utilize flip chip assemblies of FPAs, indium bump technology is used to bond the detector array to the ROIC. Specifically, each of the detector array and the ROIC include indium bumps formed on the surface thereof. The indium bumps on the opposing surfaces of each device may be mated and joined together in a process called hybridization.

Although indium has proved to be a good material for these applications, layers of native oxide may be formed on the indium bumps during the fabrication of the FPA. The native oxide may prevent proper interconnection between the detector array and ROIC. As the number of pixels increases and the sizes of the pixels decreases, the formation of native oxide on indium bumps may pose significant challenges. As such, the native oxide must be removed prior to the hybridization process.

Known techniques for removing the native oxide include a mechanical scrubbing process that includes rubbing the mated indium bumps against each other until the oxide layer breaks. This process may impose harmful mechanical stress on chip contacts and have a negative impact on yield. For example, as the surface area of the detector array increases, the force that is required to break through the oxide increases exponentially and may exceed the limits that may be withstood by commercially available devices. As a result, mechanical scrubbing may induce crystal damage and have detrimental effects on device performance. Other known techniques include the use of cleaning agents or acid etches that may also cause corrosion and/or degradation of the indium. Accordingly, known techniques for chemically or mechanically removing the native oxide layers may result in damage to FPA components and the fabrication of defective circuits.

SUMMARY OF THE INVENTION

According to embodiments of the present disclosure, a method for removing oxide includes placing a sensor chip assembly having an oxide layer formed on a portion thereof within an enclosed and controlled environment. The portion of the sensor chip assembly is exposed to a reactive gas and a UV light to result in a substantial removal of the oxide layer formed on the portion of the sensor chip assembly.

Embodiments of the disclosure may provide numerous technical advantages. For example and according to one embodiment, the native oxide layers formed on the indium bumps of a focal plane array may be removed prior to the hybridization process. In particular, the indium bumps that are used to form the interconnects may be simultaneously exposed to a combination of UV light and a reactive gas. This combination of UV light and the reactive gas may result in the substantial removal of the native oxide from the indium bumps. However, because the components of the focal plane array are not subject to mechanical forces during the removal of the native oxide, damage resulting from mechanical stress is prevented. A further technical advantage may be that the combination of UV light and the reactive gas results in removal of the native oxide layers at temperatures that are below the melting temperature of indium. Accordingly, the native oxide may be removed from a focal plane array without having a negative impact on yield or negatively effecting device performance.

Certain embodiments of the present disclosure may include some, all, or none of the above advantages. One or more other technical advantages may be readily apparent to those skilled in the art from the figures, descriptions, and claims included herein.

BRIEF DESCRIPTION OF THE DRAWINGS

To provide a more complete understanding of the present invention and the features and advantages thereof, reference is made to the following description taken in conjunction with the accompanying drawings, in which.

DETAILED DESCRIPTION OF THE DRAWINGS

Figure 1A:
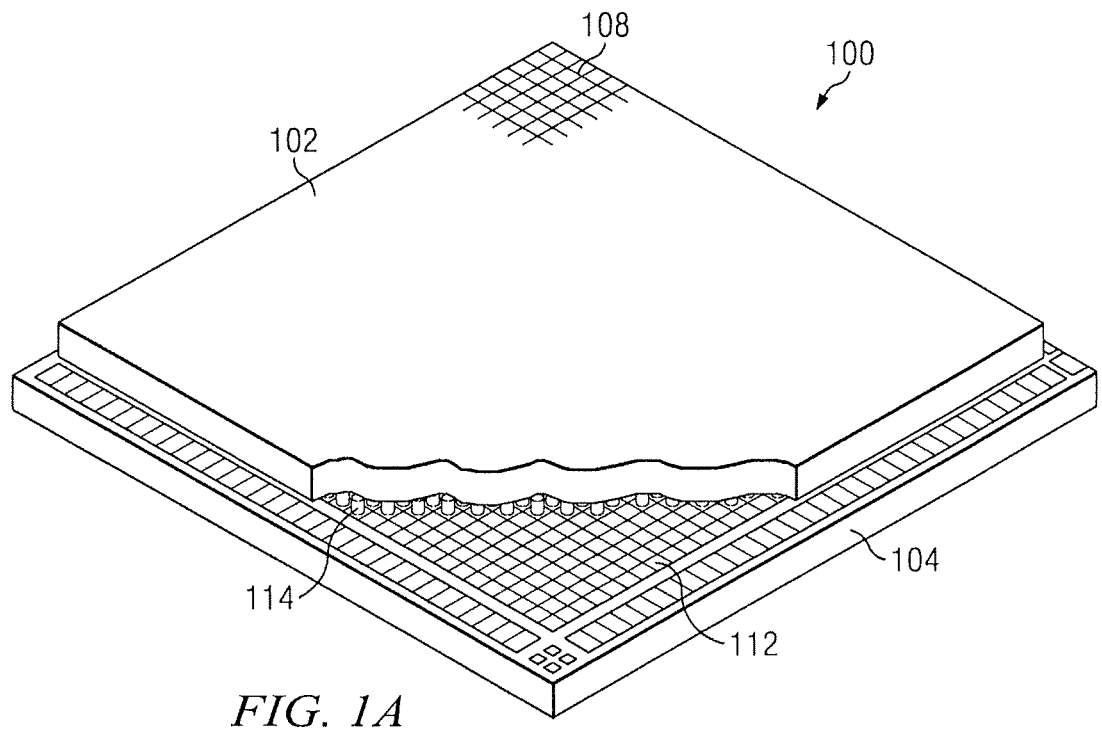
FIG. 1A illustrates an example Focal Plane Array (FPA), according to certain embodiments of the present disclosure.

FIG. 1A illustrates a schematic of an example sensor chip assembly 100, according to certain embodiments of the present disclosure. In a particular embodiment, sensor chip assembly 100 includes a conventional hybrid Focal Plane Array infrared detector assembly (FPA) utilizing flip chip technology. Accordingly, as depicted, sensor chip assembly 100 includes a compound semiconductor sensing element that may include an intrinsic or extrinsic detector array 102 that is generally aligned with an integrated circuit 104. In particular embodiments, where sensor chip assembly 100 comprises a FPA, integrated circuit 104 may include a CMOS read-out integrated circuit (ROIC). As will be described in more detail below, indium bump or other interconnect technology may be used to join detector array 102 and integrated circuit 104 on a pixel by pixel level.

As depicted, sensor chip assembly 100 includes a compound semiconductor detector array having a plurality of sensors 108 arranged in a square array. Similarly, integrated circuit 104 may also include a silicon substrate 110 having a number of contact pads 112 that generally corresponds with the number of sensors 108. Contact pads 112 may include one or more layers of various contact metals and may, in some embodiments, include a layer of gold plating. In one particular embodiment, contact pads 112 may have a surface area of approximately 10 microns×10 microns. For example, in one particular embodiment, each of detector array 102 and integrated circuit 104 may include a 4K×4K array of a total of 16 million individual sensors 108 and contact pads 112, respectively. However, it is generally recognized that the described embodiment is just one example of a FPA. Sensor chip assembly 100 may include any number of sensors 108 and contact pads 112 as is required by pixel size and capacitance requirements.

Figure 1B:
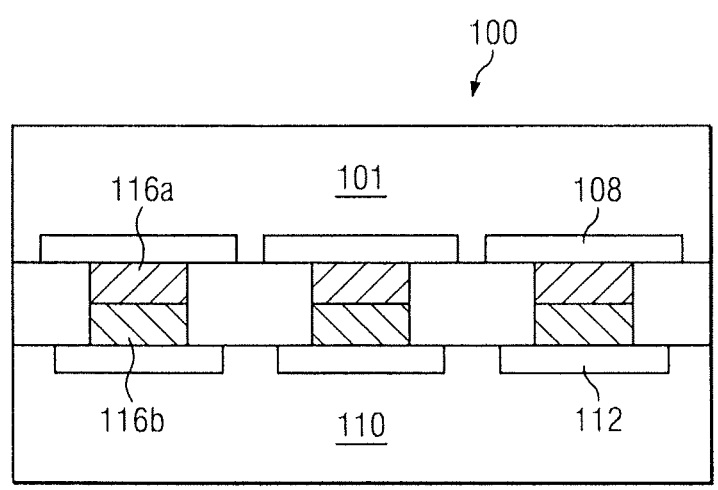
FIG. 1B illustrates example indium bump interconnections in the example FPA of FIG. 1A, according to certain embodiments of the present disclosure.

Interconnects 114 are formed between each sensor 108 and a corresponding one of contact pads 112. As can be seen from FIG. 1B, each interconnect 114 may be comprised of two indium bumps 116a and 116b. Specifically, a first indium bump 116a may be formed on a surface of a sensor 108 of detector array 102, and a second indium bump 116b may be formed on a surface of contact pad 112 of integrated circuit 104. Detector array 102 and integrated circuit 104 may then be brought together in a controlled environment for hybridization. Specifically, first and second indium bumps 116a and 116b may be mated and joined by soldering or cold-welding, in certain embodiments.

Because of its cryogenic stability, thermal and electrical conductivity, self-adhesive nature, and relative ease of application, indium has proved to be a good material for forming interconnects 114. However, it is generally recognized that, in ambient conditions, native oxide may form quickly on indium bumps 116a and 116b prior to the hybridization of detector array 102 and integrated circuit 104. The formation of native oxide is a natural occurrence when sensor chip assembly 100 is exposed to oxygen. For example, a layer of approximately 50 to 100 angstroms of indium oxide may form on indium bumps 116a and 116b when integrated circuit device is exposed to oxygen in the ambient air. The presence of the indium oxide on the opposing surfaces of indium bumps 116a and 116b, however, prevents proper interconnection between the detector array 102 and readout array 104. Accordingly, it may be necessary to remove or substantially remove the indium oxide layer from indium bumps 116a, 116b just prior to hybridization.

Prior techniques for removing the native oxide negatively affect the yield of units produced since components of the sensor chip assembly 100 may be damaged during the oxide removal process. For example, one such technique includes a mechanical scrubbing process in which the mated indium bumps 116a and 116b are rubbed against each other until the native oxide layer breaks. However, the forces required to result in the breaking up of the native oxide layer may impose harmful mechanical stress on indium bumps 116a and 116b. Damage to bumps 116a and 116b may prevent proper electrical connection and have detrimental effects on device performance. As further examples, an acid etch or clean-up agent may be used to result in the chemical removal of the native oxide. However, the acid etch may also etch the material of indium bumps 116a and 116b and other surfaces around the indium bumps and result in the fabrication of defective devices. Likewise, the use of a cleaning agent (such as flux) may require the application of a solvent to remove contaminants from the soldered connection. The solvents and fluxes must be nonconductive and noncorrosive and used in a manner that keeps the dissolved flux residue from contact surfaces. Any flux remaining in the join corrodes the connection and creates a defective device. As a further problem, environmental laws and agreements may eventually prohibit the use of these solvents.

Figure 2:
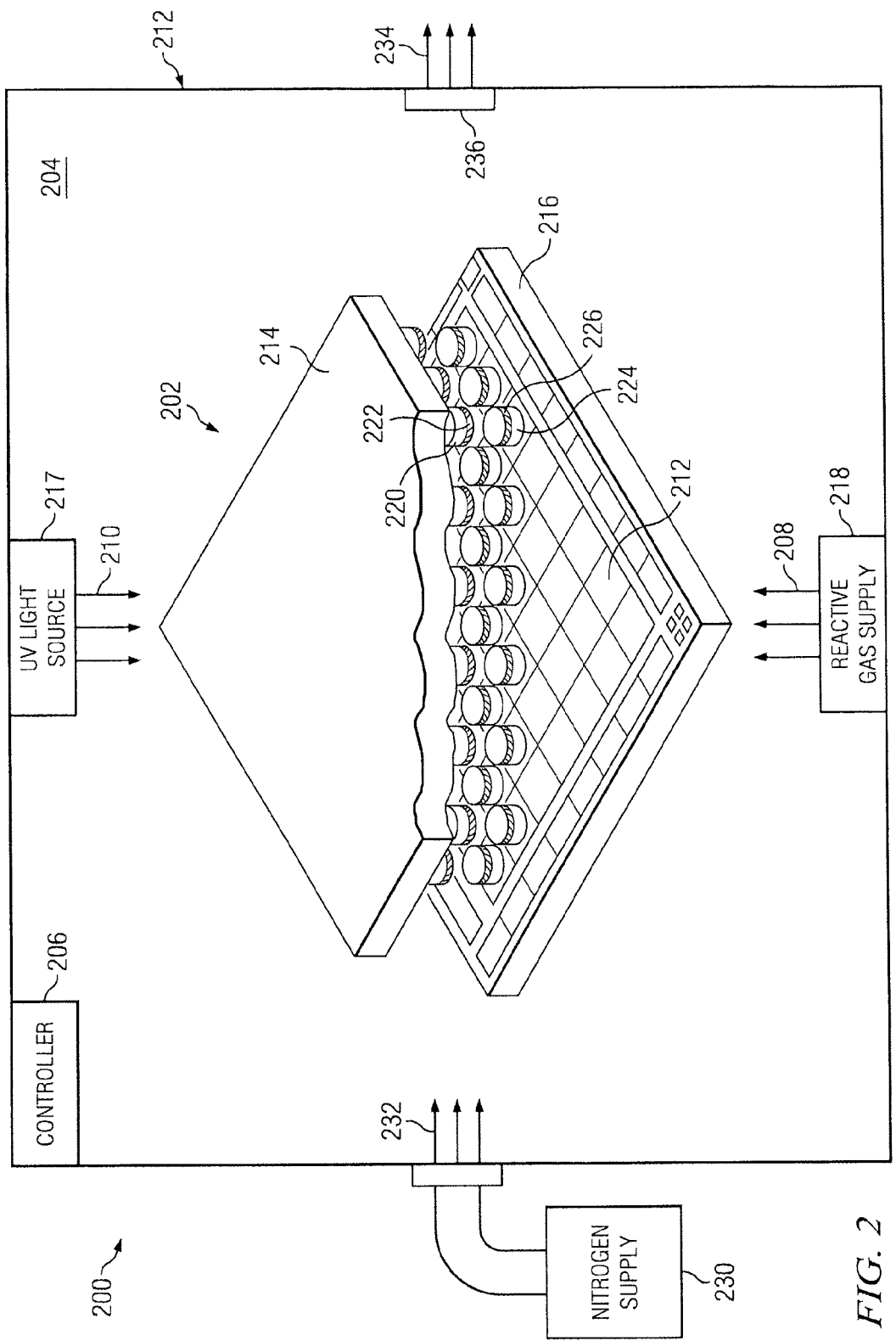
FIG. 2 illustrates an example system for removing native oxide from components of the FPA, according to certain embodiments of the present disclosure.

FIG. 2 illustrates an example system 200 for removing native oxide from components of a sensor chip assembly 202, such as a FPA, according to certain embodiments of the present disclosure. In contrast to the techniques formerly used for the removal of native oxide, system 200 provides a controlled environment 204 in which at least one controller 206 operates to simultaneously expose sensor chip assembly 202 to a reactive gas 208 and UV light 210. Controller 206 may include any hardware or software necessary for controlling the components of system 200. In certain embodiments, controller 206 may include a processor or other computing device.

System 200 includes a reactive chamber 212 that is configured to receive at least a portion of sensor chip assembly 202 prior to hybridization. As depicted, sensor chip assembly 202 includes first component 214 and second component 216. First component 214 may include a compound semiconductor detector array such as detector array 106 that is described above with respect to FIG. 1. Likewise, second component 216 may include an integrated circuit such as integrated circuit 104. In particular embodiments, second component 216 may include a CMOS ROIC. However, while both the first component 214 and the second component 216 are depicted as being contained within reactive chamber 212, it is generally recognized that either or both of first and second components 214 and 216 may be placed within reactive chamber 212 at any one time. As describe below, where both components are simultaneously received in reactive chamber 212, the oxide layers formed on either or both of components 214 and 216 may be removed and components 214 and 216 may then be joined during the hybridization process while the components are contained in reactive chamber 212.

Within reactive chamber 212, sensor chip assembly 202 may be exposed to a combination of reactive gas 208 and UV light 210 to result in the substantial removal of a native oxide layer from the interconnect components. The removal of the native oxide layer may be performed prior to the hybridization of the sensor chip assembly 202. Since the combination of reactive gas 208 and UV light 210 do not cause electrical or chemical damage to components, system 200 provides for the substantial removal of native oxide without having a detrimental effect on interconnect components or device performance. Additionally, the combination allows for the oxide layer to be removed at temperatures that are less than the melting temperature of the interconnect components.

In particular embodiments, system 200 may include a modified UV Asher such as those that are commonly found in clean rooms. Such devices may be conventionally used to burn carbon off of the surfaces of carbon components of an integrated circuit device. Thus, system includes a UV light source 217 for generating UV light 210. Additionally, system 200 is modified to include a reactive gas supply 218 that operates as a source of reactive gas 208. For example, in one example embodiment, a SAMCO UV/Ozone Asher may be modified to include reactive gas supply 218. In certain embodiments, reactive gas 208 may include a formic acid vapor or methanoic acid. For example, in particular embodiments, reactive gas 208 may be selected from the group consisting of Aminic Acid, Formylic acid, Hydrogen carboxylic acid, Hydroxymethanone, Hydroxy(oxo)methane, Metacarbonic acid, Oxocarbinic acid, and Oxomethanol.

As described above, reactive chamber 212 is configured to receive sensor chip assembly 202. While sensor chip assembly 202 may be substantially similar to sensor chip assembly 100, sensor chip assembly 202 is depicted to include FPA components prior to hybridization. Additionally, both of first component 214 and second component 216 are depicted as having native oxide layers formed on at least a portion thereof. Specifically, first component 214 has a first interconnect 220 on which an oxide layer 222 is formed. Similarly, second component 216 has a second interconnect 224 on which an oxide layer 226 is formed. Native oxide layers 222 and 226 may be naturally formed under ambient conditions when first and second components 214 and 216 are exposed to oxygen. In particular embodiments, native oxide layers 222 and 226 may be approximately 50 to 100 Angstroms thick.

System 200 maintains the temperature within the enclosed and controlled environment 204 at a temperature that is below the melting temperature of the interconnect components. For example, in a particular embodiment, the temperature of the controlled environment 204 may be maintained below a temperature of 156 degrees Celsius. System 200 may then simultaneously expose first and second components 214 and 216 to UV light 210 and reactive gas 208 for a predefined period of time that is sufficient to result in the substantial removal of native oxide layers 222 and 226 formed on interconnect components 220 and 224, respectively.

As depicted, system 200 may also include a nitrogen supply 230 configured to provide nitrogen 232 to reactive chamber 212. In particular embodiments, nitrogen 232 may be pumped into reactive chamber 212 to substantially purge reactive chamber 212 of oxygen 234. Oxygen 234 may be removed from reactive chamber 212 via a vent 236. The substantial removal of oxygen 234 may create an inert environment and prevent the further formation of native oxide 222 and/or 226 on interconnect components 220 and 224, respectively. In particular embodiments, the oxygen content within the controlled environment 204 of reactive chamber 212 may be monitored and maintained at a level that is less than 60 parts per million. In addition to purging system 200 of unwanted oxygen 234, nitrogen 232 may also be used to dilute the concentration of reactive gas 208 and, thus, maintain the concentration of reactive gas 208 at desired levels.

Figure 3:
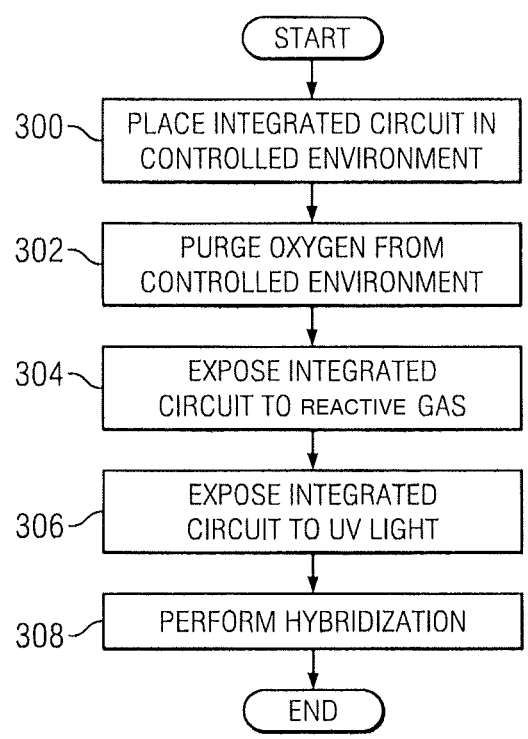
FIG. 3 illustrates an example method for removing native oxide from components of the FPA, according to certain embodiments of the present disclosure.

The operation of system 200 may be best understood in conjunction with FIG. 3, which illustrates an example method for removing native oxide from components of a FPA, according to certain embodiments of the present disclosure. The method begins at step 300 with the placing of sensor chip assembly 202 within the enclosed and controlled environment 204 prior to hybridization. As depicted, sensor chip assembly 202 includes a FPA device such as the one illustrated in FIGS. 1A and 1B. However, as described above with regard to FIG. 2, one or more layers of native oxide 222 and 226 are formed on either or both of first component 214 and second component 216. For example, native oxide layers 222 and 226 may be formed on the surface of interconnect components such as indium bumps. In one example embodiment, native oxide layers 222 and 226 may be of a thickness on the order of 50 to 100 Angstroms when formed in ambient conditions prior to the hybridization process.

At step 302, oxygen 234 may be substantially purged from the controlled environment 204. For example, and as described above, nitrogen 232 from nitrogen supply 230 may be injected into the controlled environment 204. The inflow of nitrogen 232 may force oxygen 234 to be vented from reactive chamber 212 through one or more vents 236. In particular embodiments, the oxygen content within reactive chamber 212 may be monitored and maintained at a level that is less than 60 parts per million.

At step 304, the layers of native oxide 222 and 226 formed on the surface of interconnects 220 and 224 may be exposed to reactive gas 208 supplied reactive gas supply 218. As describe above, reactive gas 208 may include a formic acid vapor and may be selected from the group consisting of Aminic Acid, Formylic acid, Hydrogen carboxylic acid, Hydroxymethanone, Hydroxy(oxo)methane, Metacarbonic acid, Oxocarbinic acid, and Oxomethanol, in particular embodiments. In one particular embodiment, the concentration of reactive gas 208 may selected such that the controlled environment 204 is made up of approximately 40%-50% of reactive gas 208 and approximately 50-60% of nitrogen 232. For example, in one particular embodiment, the controlled environment 204 may include approximately 42% of reactive gas 208 and 58% of nitrogen 232.

At step 306 and while sensor chip assembly 202 is being exposed to reactive gas 208, sensor chip assembly 202 may be simultaneously exposed to UV light 210. In a particular embodiment, for example, sensor chip assembly 202 may be simultaneously exposed to reactive gas 208 and UV light 210 for a predetermined amount of time that is at least 5 minutes. Generally, the predetermined amount of time may be more than 5 minutes but less than 10 minutes. When applied to sensor chip assembly 202 for the predetermined amount of time, the combination of reactive gas 208 and UV light 210 may result in the substantial removal of the oxide layers 222 and 226 formed on the surfaces of interconnects 220 and 224. Specifically, UV light 210 may operate to disassociate the formic acid vapor to create a plurality of CO and $H_2$ radicals. The CO and $H_2$ radicals may then operate as reducing agents to remove oxide layers 222 and 226 from interconnects 220 and 224. One example chemical reaction (where reactive gas 208 comprises HCOOH) may include:

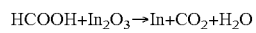
$$HCOOH + In_2O_3 \rightarrow In + CO_2 + H_2O$$

Though the above reaction of reactive gas 208 and oxide layers 222 and 226, results in the native oxide being removed from interconnects 220 and 224, reactive gas 208 does not chemically react with interconnects 220 and 224. As such, interconnects 220 and 224 are kept intact.

In addition to assisting in the disassociation of the reactive gas 208, UV light 210 may also enable reactive gas 208 to remove native oxide 222 and 226 at lower temperatures. It may be generally recognized that indium oxide remains solid up to 850 degrees Celsius. Above 850 degrees Celsius, the indium oxide layers 222 and 226 may sublime. This temperature is much higher than the melting point of indium, which is approximately 156 degrees Celsius. However, interconnects 220 and 224 may not considerably change shape even if heated above 156 degrees Celsius due to the stiff mechanical properties of the $In_2O_3$ jacket surrounding interconnects 220 and 224. Nevertheless, it is desirable to remove native oxide layers 222 and 226 at a temperature that is lower than the melting point of the material forming interconnects 220 and 224. Thus, in particular embodiments, it is desirable to remove native oxide layers 222 and 226 at a temperature that is lower than the melting point of indium. Because the presence of UV light 210 aids in the disassociation of reactive gas 208 into reducing agent radicals, reactive gas 208 may be used to remove native oxide 222 and 226 at a temperature that is below the melting temperature of Indium or another metal forming interconnects 220 and 224. For example, where sensor chip assembly 202 is exposed to both UV light 210 and reactive gas 208 at a temperature of approximately 150 degrees Celsius, the combination may result in the substantial removal of native oxide 222 and 226 after an exposure time of approximately 5 minutes. In contrast, where UV light 210 is omitted and sensor chip assembly 202 is exposed only to reactive gas 208 at an increased temperature of approximately 160 degrees Celsius, reactive gas 208 alone may not result in the substantial removal of native oxide 222 and 226 even after an exposure time of approximately 5 minutes.

Following the substantial removal of oxide layers 222 and 226, a hybridization process may then be performed at step 308. The hybridization process results in the joining of interconnects 220 and 224. For example, the hybridization process may include cold soldering of interconnects 220 and 224 formed of indium bumps.

Although the present invention has been described with several embodiments, diverse changes, substitutions, variations, alterations, and modifications may be suggested to one skilled in the art, and it is intended that the invention encompass all such changes, substitutions, variations, alterations, and modifications as fall within the spirit and scope of the appended claims.

What is claimed is:

1. A method for removing oxide comprising:
    providing an enclosed and controlled environment, the temperature of the enclosed and controlled environment maintained below 156 degrees Celsius;
    placing a focal plane array within the enclosed and controlled environment, the focal plane array comprising at least one interconnect component formed of indium, wherein an oxide layer is formed on the at least one interconnect component;
    supplying nitrogen gas within the enclosed and controlled environment to substantially purge the enclosed and controlled environment of oxygen;
    exposing the at least one interconnect component of the focal plane array to a formic acid vapor; and
    while exposing the at least one interconnect component to the formic acid vapor, exposing the at least one interconnect component to UV light, wherein the simultaneous exposure of the at least one interconnect component to the formic acid vapor and the UV light results in a substantial removal of the oxide layer formed on the at least one interconnect component.

2. The method of claim 1, further comprising after the substantial removal of the oxide layer from the at least one interconnect component and while the focal plane array is within the enclosed and controlled environment, mating the at least interconnect component with a second interconnect component; and
    soldering the first interconnect component and the second interconnect component to form an interconnect.

3. A method for removing oxide comprising:
    placing a sensor chip assembly within an enclosed and controlled environment, the sensor chip assembly having an oxide layer formed on an indium portion of the sensor chip assembly;
    exposing the portion of the sensor chip assembly to a reactive gas comprising a formic acid vapor; and
    while exposing the portion of the sensor chip assembly to the reactive gas, exposing the portion of the sensor chip assembly to UV light to result in a substantial removal of the oxide layer formed on the indium portion of the sensor chip assembly.

4. The method of claim 3, further comprising maintaining a temperature of the enclosed and controlled environment below 156 degrees Celsius.

5. The method of claim 3, wherein the sensor chip assembly comprises a Focal Plane Array (FPA).

6. The method of claim 3, further comprising:
    using the UV light to disassociate the formic acid vapor to create a plurality of radicals; and
    reacting the radicals with the oxide layer to result in the substantial removal of the oxide layer from the portion of the sensor chip assembly.

7. The method of claim 3, wherein the reactive gas comprises a formic acid selected from the group consisting of methanoic acid, Aminic acid, Formylic acid, Hydrogen carboxylic acid, Hydroxymethanone, Hydroxy(oxo)methane, Metacarbonoic acid, Oxocarbinic acid, and Oxomethanol.

8. The method of claim 3, wherein exposing the portion of the sensor chip assembly to the reactive gas comprises exposing the portion of the sensor chip assembly to the reactive gas for at least 5 minutes.

9. The method of claim 3, wherein:
    the sensor chip assembly comprises one or more of a detector array and a readout integrated circuit; and
    the indium portion on which the oxide layer is formed comprises an interconnect of one or more of the detector array and a readout integrated circuit.

10. The method of claim 9, wherein the sensor chip assembly comprises:
    a first component comprising a detector array having a first interconnect component; and
    a second component comprising a readout integrated circuit having a second interconnect component, and
    wherein the indium portion of the sensor chip assembly on which the oxide layer is formed comprises one or more of the first interconnect component and the second interconnect component.

11. The method of claim 3, further comprising supplying nitrogen gas within the enclosed and controlled environment to substantially purge the enclosed and controlled environment of oxygen.

12. The method of claim 11, wherein the reactive gas comprises approximately 40-50% and the nitrogen gas comprises approximately 50-60% of the controlled environment.

13. A method for removing oxide comprising:
    placing a sensor chip assembly within an enclosed and controlled environment, the sensor chip assembly having an oxide layer formed on a portion of the sensor chip assembly, wherein the sensor chip assembly comprises one or more of a detector array and a readout integrated circuit and the portion on which the oxide layer is formed comprises an interconnect of one or more of the detector array and a readout integrated circuit;
    the sensor chip assembly further comprising a first component comprising a detector array having a first interconnect component, and a second component comprising a readout integrated circuit having a second interconnect component, and wherein the portion of the sensor chip assembly on which the oxide layer is formed comprises one or more of the first interconnect component and the second interconnect component;
    exposing the portion of the sensor chip assembly to a reactive gas;
    while exposing the portion of the sensor chip assembly to the reactive gas, exposing the portion of the sensor chip assembly to UV light to result in a substantial removal of the oxide layer formed on the portion of the sensor chip assembly;
    after the substantial removal of the oxide layer from the portion of the sensor chip assembly and while the sensor chip assembly is within the enclosed and controlled environment, mating the first interconnect component with the second interconnect component; and
    soldering the first interconnect component and the second interconnect component to form an interconnect.

* * * * *